(12) United States Patent
Rathburn

(10) Patent No.: US 9,076,884 B2
(45) Date of Patent: Jul. 7, 2015

(54) COMPLIANT PRINTED CIRCUIT SEMICONDUCTOR PACKAGE

(71) Applicant: HSIO TECHNOLOGIES, LLC, Maple City, MN (US)

(72) Inventor: James Rathburn, Maple Grove, MN (US)

(73) Assignee: HSIO TECHNOLOGIES, LLC, Maple Grove, MN (US)

( * ) Notice: Subject to any disclaimer, the term of this patent is extended or adjusted under 35 U.S.C. 154(b) by 117 days.

(21) Appl. No.: 14/086,029

(22) Filed: Nov. 21, 2013

(65) Prior Publication Data

US 2014/0080258 A1 Mar. 20, 2014

Related U.S. Application Data

(62) Division of application No. 13/318,263, filed as application No. PCT/US2010/036285 on May 27, 2010, now Pat. No. 8,618,649.

(60) Provisional application No. 61/183,348, filed on Jun. 2, 2009.

(51) Int. Cl.
*H01L 21/00* (2006.01)
*H01L 23/00* (2006.01)
(Continued)

(52) U.S. Cl.
CPC .......... *H01L 24/82* (2013.01); *H01L 23/49811* (2013.01); *H01L 23/5389* (2013.01);
(Continued)

(58) Field of Classification Search
CPC ............... H01L 2924/1306; H01L 2924/00; H01L 2924/01004; H01L 2924/01006; H01L 2924/01013; H01L 2924/01015; H01L 2924/01029; H01L 2924/01033; H01L 2924/01046; H01L 2924/01047; H01L 2924/01049; H01L 2924/01075; H01L 2924/01079; H01L 2924/01082; H01L 2924/01087; H01L 2924/014; H01L 2924/09701; H01L 2924/12044; H01L 2924/14; H01L 2924/15174; H01L 2924/15311; H01L 2924/19041; H01L 2924/19042; H01L 2924/19043; H01L 2924/3011; H01L 2924/3025; H01L 2224/04105; H01L 2224/20; H01L 23/49811; H01L 23/5389; H01L 24/18; H01L 24/19
USPC .................. 438/68, 113, 114, 458, 460–465, 438/FOR. 386; 257/E21.596, E21.599, 688, 257/774
See application file for complete search history.

(56) References Cited

U.S. PATENT DOCUMENTS 3,672,986 A 6/1972 Schneble, Jr. et al.
4,188,438 A 2/1980 Burns
(Continued)

FOREIGN PATENT DOCUMENTS

JP 2003/217774 7/2003
WO WO 91/14015 9/1991
(Continued)

OTHER PUBLICATIONS

Notice of Allowance and Fee(s) Due mailed Nov. 24, 2014 in co-pending U.S. Appl. No. 13/266,486, now published as US Patent Application Publication No. US 2012/0055701.
(Continued)

*Primary Examiner* — Chuong A Luu
*Assistant Examiner* — Cory Eskridge
(74) *Attorney, Agent, or Firm* — Stoel Rives LLP

(57) ABSTRACT

A method of making a package for a semiconductor device having electrical terminals. At least one semiconductor device is located on a substrate. A first dielectric layer is printed on at least a portion of the semiconductor device to include first recesses aligned with a plurality of the electrical terminals. A conductive material is deposited in the first recesses forming contact members. A second dielectric layer is printed on at least a portion of the first dielectric layer to include second recesses aligned with a plurality of the first recesses. A conductive material is deposited in at least a portion of the second recesses to include a circuit geometry and a plurality of exposed terminals. A compliant material is deposited in recesses in one or more of the first and second dielectric layers adjacent to a plurality of the exposed terminals.

20 Claims, 13 Drawing Sheets

(51) Int. Cl.
  *H01L 23/498* (2006.01)
  *H01L 23/538* (2006.01)
  *H05K 1/18* (2006.01)

(52) U.S. Cl.
  CPC ....... *H01L24/18* (2013.01); *H01L 2224/04105* (2013.01); *H01L 2224/20* (2013.01); *H01L 2924/01004* (2013.01); *H01L 2924/01013* (2013.01); *H01L 2924/01015* (2013.01); *H01L 2924/01029* (2013.01); *H01L 2924/01046* (2013.01); *H01L 2924/01049* (2013.01); *H01L 2924/01075* (2013.01); *H01L 2924/01079* (2013.01); *H01L 2924/01082* (2013.01); *H01L 2924/09701* (2013.01); *H01L 2924/12044* (2013.01); *H01L 2924/14* (2013.01); *H01L 2924/15174* (2013.01); *H01L 2924/15311* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H05K 1/185* (2013.01); *H01L 2924/01006* (2013.01); *H01L 2924/01033* (2013.01); *H01L 2924/01047* (2013.01); *H01L 2924/01087* (2013.01); *H01L 2924/014* (2013.01); *H01L 24/19* (2013.01); *H01L 2924/1306* (2013.01)

(56) References Cited

U.S. PATENT DOCUMENTS

| | | | |
|---|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,071,363 A | 12/1991 | Reylek et al. |
| 5,072,520 A | 12/1991 | Nelson |
| 5,127,837 A | 7/1992 | Shah et al. |
| 5,129,573 A | 7/1992 | Duffey |
| 5,161,983 A | 11/1992 | Ohno |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |

(56) References Cited

U.S. PATENT DOCUMENTS

| | | |
|---|---|---|
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |

(56) References Cited

U.S. PATENT DOCUMENTS

| | | |
|---|---|---|
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0281303 A1 | 12/2006 | Trezza et al. |
| 2007/0021002 A1 | 1/2007 | Laurx et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1* | 2/2009 | Beer et al. ............... 257/693 |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |
| WO | WO-2015/006393 | 1/2015 |

OTHER PUBLICATIONS

Supplemental Notice of Allowance mailed Dec. 24, 2014 in co-pending U.S. Appl. No. 13/266,486, now published as US Patent Application Publication No. US 2012/0055701.

Supplemental Notice of Allowance mailed Dec. 19, 2014 in co-pending U.S. Appl. No. 13/318,181, now published as US Patent Application Publication No. US 2012/0044659.

(56) References Cited

OTHER PUBLICATIONS

Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.

(56) References Cited

OTHER PUBLICATIONS

Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Print—Definition of Print by The Free Dictionary, http://www.thefreedictionary.com/print, Aug. 13, 2014.

(56) References Cited

OTHER PUBLICATIONS

Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/320,285, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority mailed Oct. 27, 2014 in International Application No. PCT/US2014/045856.
*Ex Parte Quayle* Action mailed Oct. 1, 2014 in co-pending U.S. Appl. No. 13/266,486, now published as US Patent Application Publication No. US 2012/0055701.
Amendment and Response After *ExParte Quayle* Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.

(56) References Cited

OTHER PUBLICATIONS

Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Notification of Transmittal of the International Search Report and the Written Opinion of the International Searching Authority mailed Jun. 3, 2013 in International Application No. PCT/US2013/031395.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 7, 2013 in International Application No. PCT/US2013/030856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Restriction Requirement mailed Oct. 1, 2013 in co-pending U.S. Appl. No. 13/266,573, now published as US Patent Application Publication No. 2012/0061846.

(56) References Cited

OTHER PUBLICATIONS

Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 26, 2013 in co-pending U.S. Appl. No. 13/319,120 now published as US Patent Application Publication No. US 2012/0061851.
Restriction Requirement mailed Oct. 1, 2013 in co-pending U.S. Appl. No. 13/319,145, now published as US Patent Application Publication No. 2012/0049342.
Examiner-Initiated Interview Summary mailed Mar. 14, 2013 in co-pending U.S. Appl. No. 13/319,228, now published as US Patent Application Publication No. US 2012/0058653.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.
Notice of Allowance and Fee(s) Due mailed Oct. 2, 2013 in co-pending U.S. Appl. No. 13/448,865, now published as US Patent Application Publication No. US 2012/0199985.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Jul. 28, 2013 in co-pending U.S. Appl. No. 13/448,914, now published as US Patent Application Publication No. US 2012/0202364.
Co-pending U.S. Appl. No. 13/969,953 titled Compliant Conductive Nano-Particle Electrical Interconnect, filed Aug. 19, 2013.
Co-pending U.S. Appl. No. 14/058,863 titled Compliant Core Peripheral Lead Semiconductor Socket, filed Oct. 21, 2013.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.

(56) References Cited

OTHER PUBLICATIONS

Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.

* cited by examiner

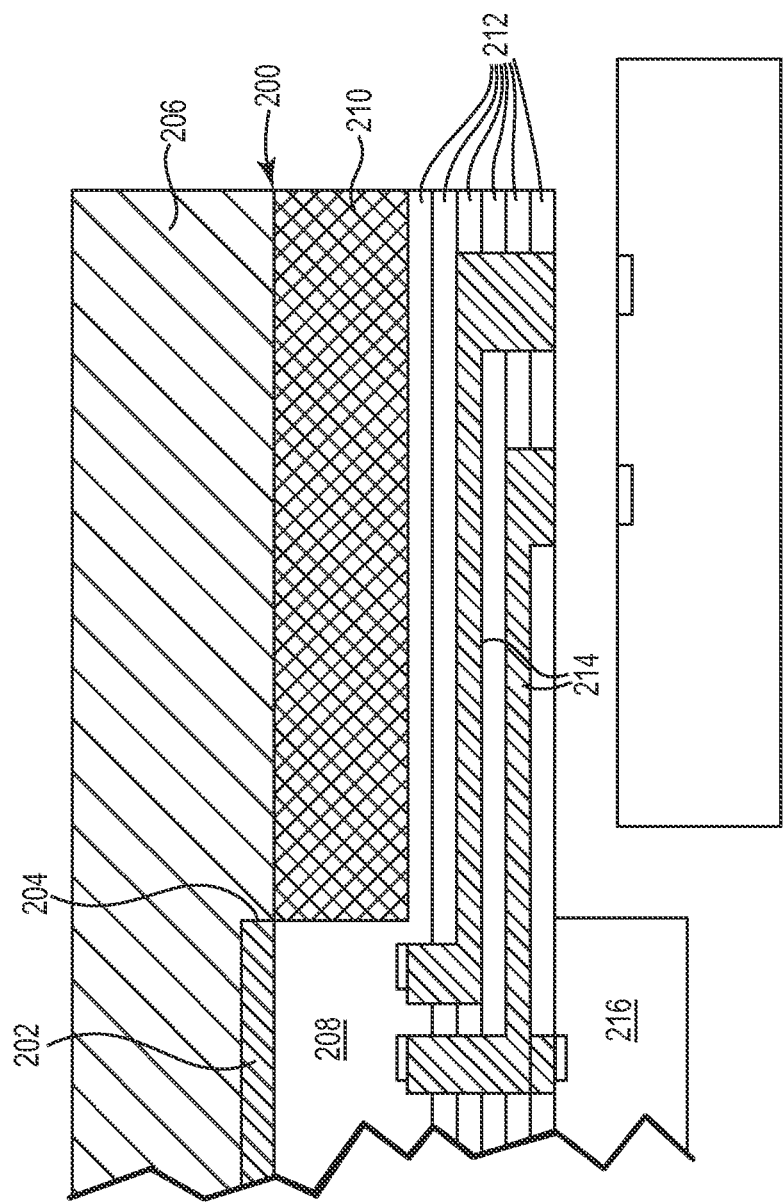

COMPLIANT PRINTED CIRCUIT SEMICONDUCTOR PACKAGE

The present application is a divisional application of U.S. Ser. No. 13/318,263, entitled Compliant Printed Circuit Semiconductor Package, filed Oct. 31, 2011 (Allowed), which is a section 371 application of PCT/U.S.2010/36285, entitled Compliant Printed Circuit Semiconductor Package, filed May 27, 2010, which claims the benefit of U.S. Provisional Application No. 61/183,348, entitled Compliant Printed Circuit Known Good Die (KGD) Vehicle or Semiconductor Package, filed Jun. 2, 2009, the entire disclosures of which are hereby incorporated by reference.

TECHNICAL FIELD

The present application is directed to a simulated or actual semiconductor package that leverages the capabilities of additive printing processes to provide a high performance package capable of interconnecting single or multiple devices in a permanent or separable fashion.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. In many cases, the size and distance between die terminals is so small that the device cannot be connected to the final PCB without some sort of fan out or routing. The packages also serve to protect the fragile silicon or provide additional functions such as thermal management or near device decoupling. In many cases, the size and distance between die terminals is so small that the IC device cannot be connected to the final PCB without some sort of re-routing interface.

Most IC devices are produced with terminals in either a peripheral pattern that runs along the edges of the IC device or an area array pattern that spans across the surface of the IC device. A main method for attachment when the terminals are in an area array pattern is to connect the terminals with solder. Basically, the package has an array of terminals that correspond to the IC device terminals. Solder is applied the terminals on the IC device and/or the package and reflowed to create the mechanical and electrical connection in a process commonly called flip chip attachment. In a flip chip attachment the IC device is flipped over to mate the terminals on the die to the terminals on the IC package substrate.

The IC devices in these types of packages are often under filled with an epoxy of some type to provide support and strength to the solder joints. The epoxy protects the solder joints during use from thermal expansion, miss-match and/or shock. In both cases, the connection of the IC device to the package is generally not reworkable once packaged and if there is a missing or broken connection it is difficult to repair.

Once the IC devices are packaged, they are usually tested in a variety of ways to determine the reliability and performance of the IC devices in the package as they would be used in the final application. In many cases, the functional performance of the IC device is not known prior to placing it into the package and if the packaged IC device fails testing the cost of the package and processing is lost.

Area array packaging has been utilized for many years, and provides a method for interconnecting IC devices with larger terminal counts than peripheral lead packaging. In general, the area array packaging is more expensive due to the larger pin counts and more sophisticated substrates required. The main limitations for area array packaging are the terminal pitch, thermal management, cost, ability to rework faulty IC devices and reliability of the solder joints.

There also have been advancements in recent years in both package types where multiple IC devices are placed in the same package, creating what has been nicknamed SiP or "system in package". Placing multiple IC devices in a single package further complicates the problems discussed above.

BRIEF SUMMARY OF THE INVENTION

The present disclosure is directed to providing a simulated or actual semiconductor package that leverages the capabilities of additive printing processes to provide a high performance package capable of interconnecting a single or multiple IC devices in a permanent or separable fashion. The present semiconductor package preferably permits the IC devices to be tested prior to final packaging.

The present compliant printed circuit semiconductor package resembles a traditional package in construction, but utilizes additive printing processes rather than conventional subtractive processes. The unique nature of the additive printing processes allows for a direct writing of circuitry and dielectrics, with the added benefit of stress decoupling at the terminal joints as well as embedded function not seen in traditional packaging.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

One embodiment is directed to a package for at least one semiconductor device and a method for making the package. At least one dielectric layer is selectively printed on at least a portion of the semiconductor device creating first recesses aligned with a plurality of the electrical terminals. A conductive material is printed in the first recesses forming contact members on the semiconductor device. At least one dielectric layer is selectively printed on at least a portion of the package to create a plurality of second recesses corresponding to a target circuit geometry. A conductive material is printed in at least a portion of the second recesses to create a circuit geometry. The circuit geometry includes a plurality of exposed terminals electrically coupled to the electric terminals on the semiconductor device.

Conductive plating is preferably added to one or more of the contact members and the circuit geometry. The conductive material can be sintered conductive particles or a conductive ink. In one embodiment, a compliant material is located between the exposed terminals and the substrate. In another embodiment, at least one electrical device is printed on one of a dielectric layer or the substrate and electrically coupled to at least a portion of the circuit geometry. The exposed terminals preferably extend above the package.

The resulting circuit geometry preferably has conductive traces that have substantially rectangular cross-sectional shapes, corresponding to the second recesses. The use of additive printing processes permit conductive material, non-conductive material, and semi-conductive material to be located on a single layer.

In one embodiment, pre-formed conductive trace materials are located in the second recesses. The second recesses are than plated to form conductive traces with substantially rectangular cross-sectional shapes. In another embodiment, a conductive foil is pressed into at least a portion of the second recesses. The conductive foil is sheared along edges of the second recesses. The excess conductive foil not located in the second recesses is removed and the second recesses are plated to form conductive traces with substantially rectangular cross-sectional shapes.

In another embodiment, at least one external dielectric layer extends beyond the package. External routing is printed on the external dielectric layer and electrically coupled to a portion of the circuit geometry.

The package can include a plurality of semiconductor devices. The circuit geometry may include at least one of an inter-die circuit path or an intra-die circuit paths. The semiconductor devices are optionally arranged in a stacked configuration.

The present disclosure is also directed to an electrical assembly including a circuit member with a plurality of contact pads electrically coupled to the exposed terminals on the package. The circuit member can be selected from one of a dielectric layer, a printed circuit board, a flexible circuit, a bare die device, an integrated circuit device, organic or inorganic substrates, or a rigid circuit.

This present compliant printed semiconductor package enables internal and/or external compliance to enhance the mechanical performance of the circuit. The present semiconductor package can be produced digitally, without tooling or costly artwork. The semiconductor package can be produced as a "Green" product, with dramatic reductions in environmental issues related to the production of conventional semiconductor packages.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the compliant printed semiconductor package reduces parasitic electrical effects and impedance mismatch, potentially increasing the current carrying capacity.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

The compliant printed semiconductor package can be configured with conductive traces that reduce or redistribute the terminal pitch, without the addition of an interposer or daughter substrate. Grounding schemes, shielding, electrical devices, and power planes can be added to the semiconductor package, reducing the number of connections to the PCB and relieving routing constraints while increasing performance.

The present disclosure is also directed to a method of making a package for a semiconductor device having electrical terminals. The method includes locating at least one semiconductor device on a substrate. A first dielectric layer is printed on at least a portion of the semiconductor device to include first recesses aligned with a plurality of the electrical terminals. A conductive material is deposited in the first recesses forming contact members on the semiconductor device. A second dielectric layer is printed on at least a portion of the first dielectric layer to include second recesses aligned with a plurality of the first recesses. A conductive material is deposited in at least a portion of the second recesses to include a circuit geometry. The circuit geometry includes a plurality of exposed terminals. A compliant material is deposited in recesses in one or more of the first and second dielectric layers adjacent to a plurality of the exposed terminals to permit the exposed terminals to move within the dielectric layers relative to the substrate.

BRIEF DESCRIPTION OF THE SEVERAL VIEWS OF THE DRAWING

FIG. 13 illustrates a layered multichip compliant printed semiconductor package in accordance with an embodiment of the present disclosure.

DETAILED DESCRIPTION OF THE INVENTION

Figure 1:
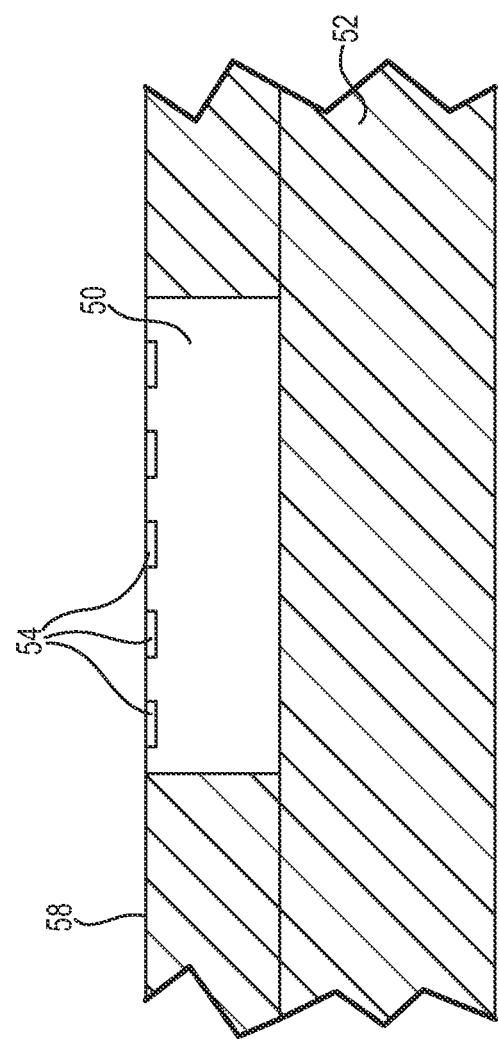
FIG. 1 is a cross-sectional view of a method of making a compliant printed semiconductor package in accordance with an embodiment of the present disclosure.

FIG. 1 is a side sectional view of IC device 50 located on substrate 52 with IC terminals 54 facing up. The substrate 52 may be a temporary work surface or may be a portion of the final semiconductor package. The substrate 52 can be constructed from a variety of rigid or flexible polymeric materials, such as for example, UV stabilized tetrafunctional epoxy resin systems referred to as Flame Retardant 4 (FR-4); bis-maleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyester (PET), polyimide (PI), polyethylene napthalate (PEN), Polyetherimide (PEI), along with various fluropolymers (FEP) and copolymers, and Ryton® available from Phillips Petroleum Company. For some applications, the substrate 52 can be a polyimide film due to their advantageous electrical, mechanical, chemical, and thermal properties.

Figure 2:
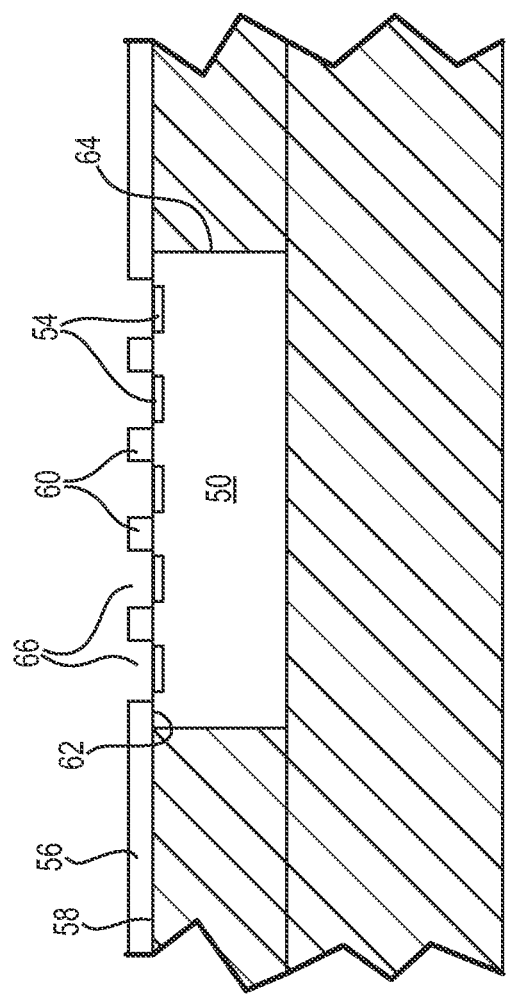
FIG. 2 illustrates a method of printing dielectric material on the semiconductor package of FIG. 1.

FIG. 2 illustrates printed layer 56 printed to top surface 58 of the substrate 52 and at locations 60 between IC terminal 54. In the illustrate embodiment, the cover layer 56 overlaps edges 62 the IC device 50 and helps to retain it in recess 64 in the substrate 52. The printed layer 56 at locations 60 creates one or more recesses 66 corresponding to each of the IC terminals 54 that are used in subsequent steps of the process.

Figure 3:
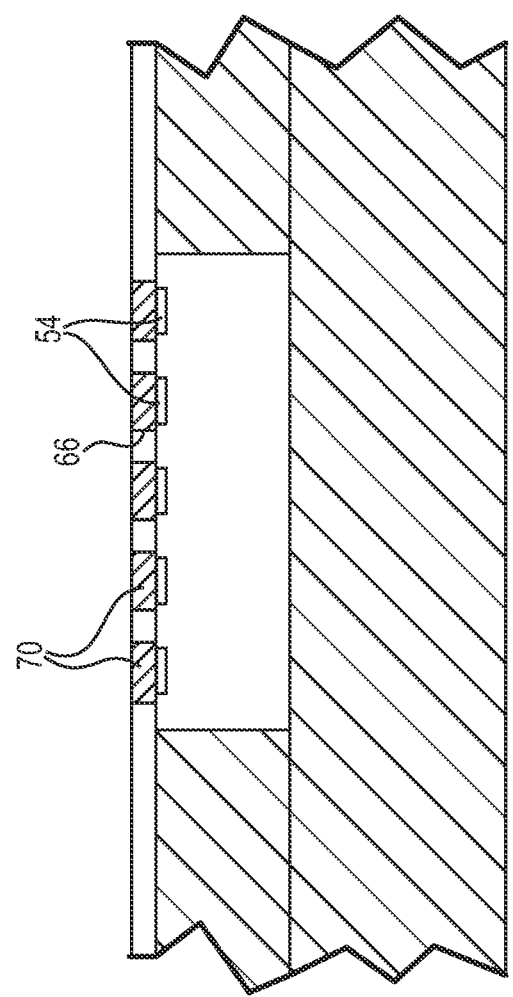
FIG. 3 illustrates a method of printing contact members on the semiconductor package of FIG. 1.

As illustrated in FIG. 3, the recesses 66 for the IC terminals 54 are metalized to create contact members 70. Metalizing can be performed by printing conductive particles followed by a sintering step, by printing conductive inks, or a variety of other techniques. The metalizing material is preferably of copper or similar metallic materials such as phosphor bronze or beryllium-copper. The resulting contact members 70 are optionally plated to improve conductive properties. The plating is preferably a corrosion resistant metallic material such as nickel, gold, silver, palladium, or multiple layers thereof.

Figure 4:
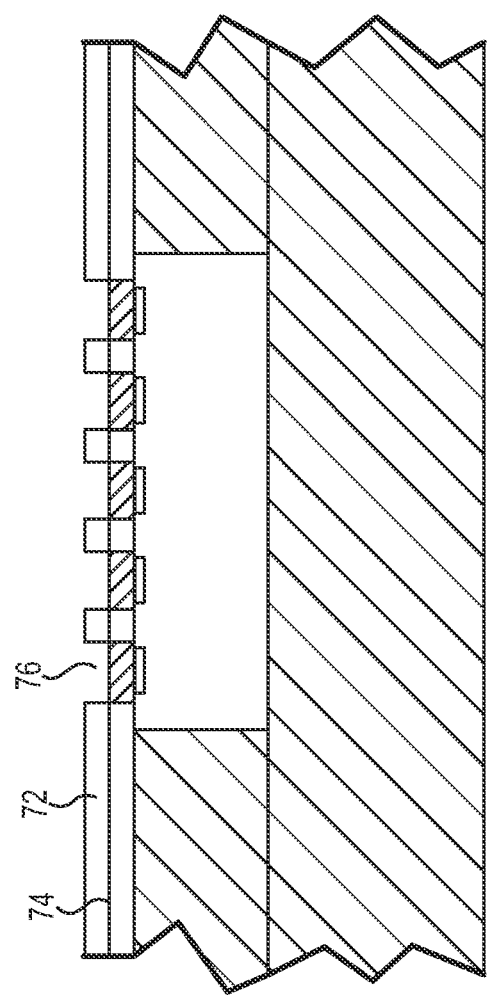
FIGS. 4 and 5 illustrate a method of printing circuit geometry on the semiconductor package of FIG. 1.
Figure 5:
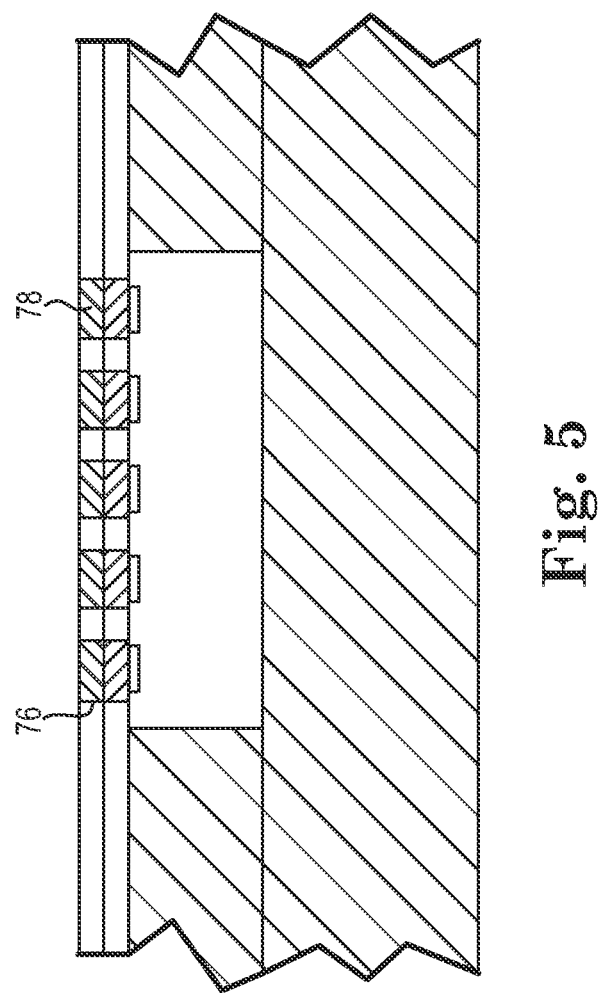

As illustrated in FIG. 4, dielectric layer 72 is printed on surface 74 with recesses 76 corresponding to a desired circuit geometry. Alternatively, the dielectric layer 72 is placed on surface 74. The recesses 76 can be defined by printing, embossing, imprinting, chemical etching with a printed mask, or a variety of other techniques. As illustrated in FIG. 5, the recesses 76 are metalized as discussed above to create circuit geometry 78.

In one embodiment, the circuit geometry 78 is formed by depositing a conductive material in a first state in the recesses 76, and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 66, 76 in the layers 56, 72, 82, 84, 86 permit control of the location, cross section, material content, and aspect ratio of the contact members 70 and the conductive traces in the circuit geometry 78. Maintaining the conductive traces with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 66, 76 to control the aspect ratio of the conductive traces results in a more rectangular or square cross-section of the conductive traces in the circuit geometry 78, with the corresponding improvement in signal integrity.

In another embodiment, pre-patterned or pre-etched thin conductive foil circuit traces are transferred to the recesses 66, 76. For example, a pressure sensitive adhesive can be used to retain the copper foil circuit traces in the recesses 66, 76. The trapezoidal cross-sections of the pre-formed conductive foil traces are then post-plated. The plating material fills the open spaces in the recesses 66, 76 not occupied by the foil circuit geometry, resulting in a substantially rectangular or square cross-sectional shape corresponding to the shape of the recesses 66, 76.

In another embodiment, a thin conductive foil is pressed into the recesses 64, 76, and the edges of the recesses 66, 76 act to cut or shear the conductive foil. The process locates a portion of the conductive foil in the trenches 66, 76, but leaves the negative pattern of the conductive foil not wanted outside and above the trenches 66, 76 for easy removal. Again, the foil in the trenches 66, 76 is preferably post plated to add material to increase the thickness of the conductive traces in the circuit geometry 78 and to fill any voids left between the conductive foil and the recesses 66, 76.

Figure 6:
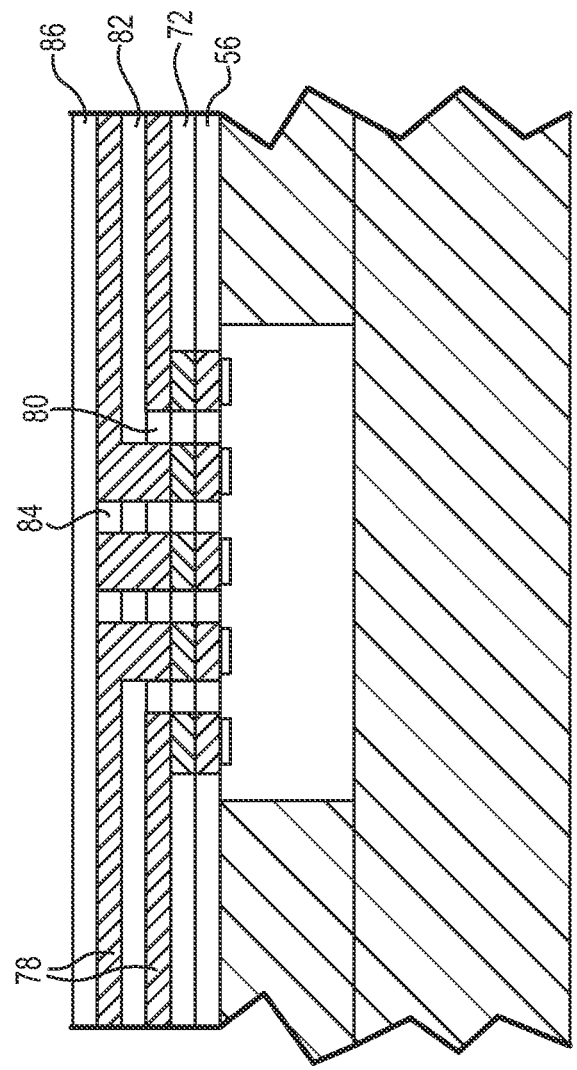
FIG. 6 illustrates a compliant printed semiconductor package in accordance with an embodiment of the present disclosure.

FIG. 6 illustrates additional printed dielectric layers 80, 82, 84, 86 creating additional recesses that are metalized to extend the circuit geometry 78. The dielectric layer 56, 72, 80, 82, 84, 86 may be constructed of any of a number of dielectric materials that provide electrostatic dissipation or to reduce cross-talk between the traces of the circuit geometry 62. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 7:
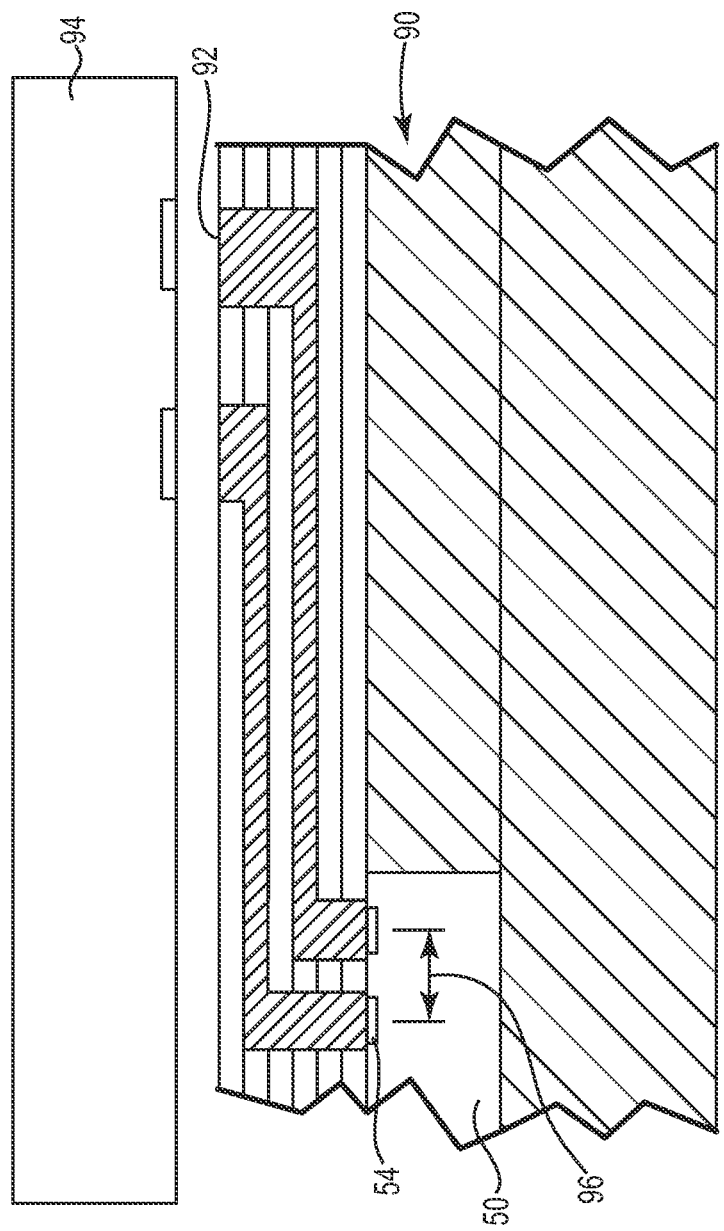
FIG. 7 illustrates the compliant printed semiconductor package of FIG. 6 coupled to a circuit member in accordance with an embodiment of the present disclosure.

FIG. 7 illustrates the circuit geometry 78 routing the IC terminals 54 out of semiconductor package 90. The size and pitch of exposed terminals 92 are printed to electrically couple the IC device 50 to another circuit member 94, such as a printed circuit board or a socket. The semiconductor package 90 permits fine contact-to-contact spacing 96 (pitch) on the order of less than 1.0 mm pitch, and more preferably a pitch of less than about 0.7 millimeter, and most preferably a pitch of less than about 0.4 millimeter.

The present semiconductor package 90 permits the performance of the IC device 50 to be evaluated before being incorporated into a system in package or multi-chip module before final packaging, permitting the individual die to be replaced if necessary. The additive process disclosed herein also permits the circuit geometry 78 to be written directly on the IC device 50, without the need of the intermediate die bonding step.

Figure 8:
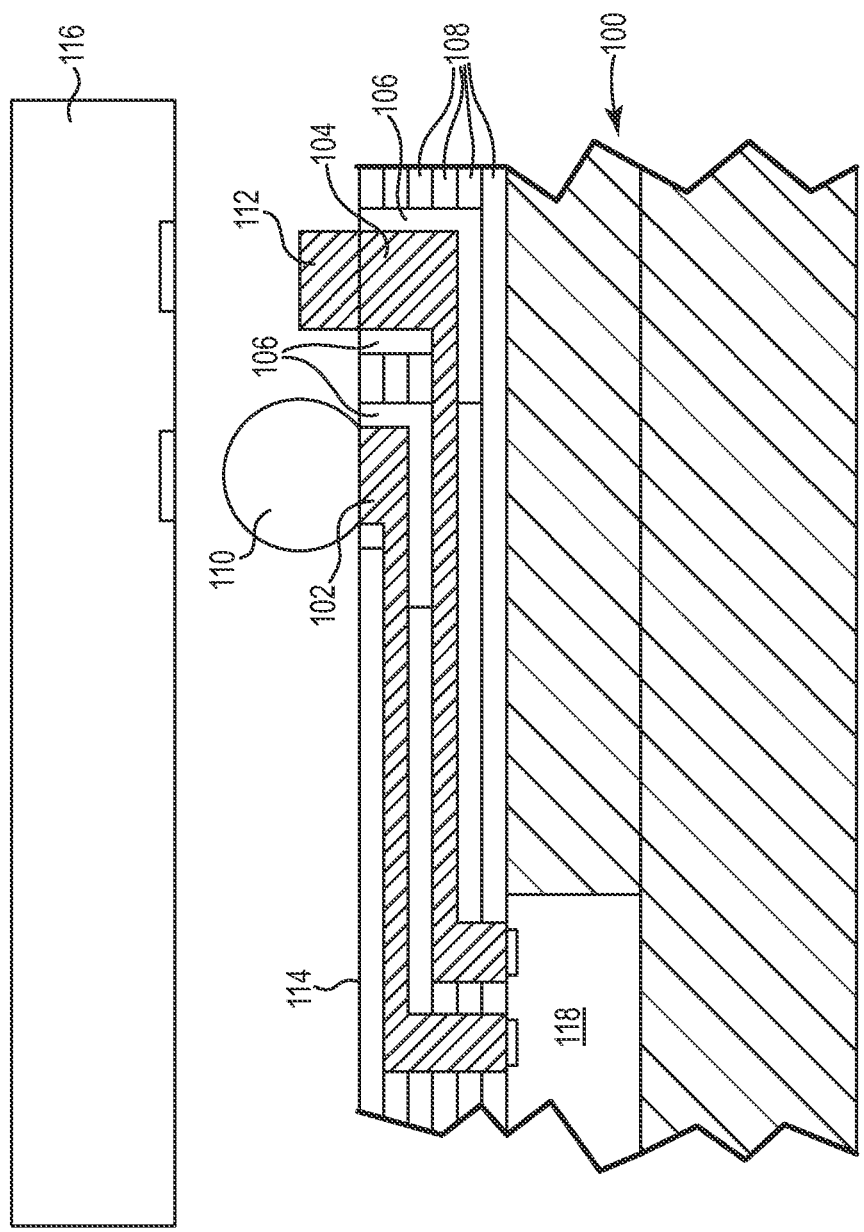
FIG. 8 illustrates an alternate compliant printed semiconductor package with printed compliant regions in accordance with an embodiment of the present disclosure.

FIG. 8 illustrates an alternate semiconductor package 100 with modified terminals 102, 104 in accordance with an embodiment of the present disclosure. Resilient regions 106 are preferably printed during the creation of layers 108. In the preferred embodiment, dielectric material is printed to leave a recess into which the resilient materials are deposited, preferably by printing. The resilient regions 106 permit the terminals 102, 104 to move in all six degrees of freedom (X-Y-Z-Pitch-Roll-Yaw) to facilitate electrical coupling with circuit member 116.

The resilient regions 106 increase the compliance of the modified terminals to permit electrical coupling by compression, without the need to solder the semiconductor package 100. The semiconductor package 100 permits IC device 118 to be tested prior to final packaging, dramatically improving yields. In one embodiment, solder ball 110 is located on terminal 102. In another embodiment, conductive material 112 is printed on the terminal so it extends above surface 114 of the semiconductor package 100.

The embodiment of FIG. 8 can be pressed against circuit member 116 and powered without the need for a socket. Alternatively, the semiconductor package 100 can be inserted into an LGA or BGA socket, or soldered to circuit member 116. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Figure 9:
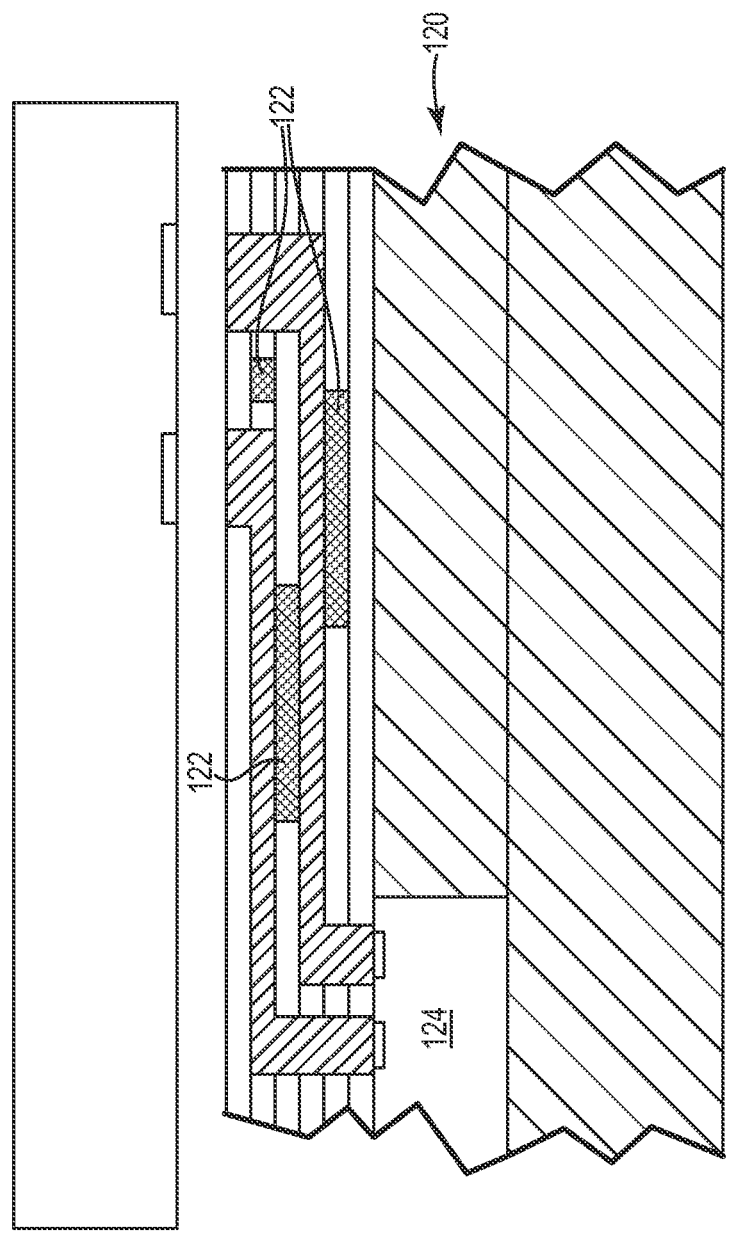
FIG. 9 illustrates an alternate compliant printed semiconductor package with printed electrical devices in accordance with an embodiment of the present disclosure.

FIG. 9 illustrates an alternate semiconductor package 120 with printed electrical devices 122 in accordance with an embodiment of the present disclosure. The electrical devices 122 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

The electrical devices 122 are preferably printed during construction of the semiconductor package 120. The electrical devices 122 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 122 can be formed using printing technology, adding intelligence to the semiconductor package 120. Features that are typically located on the IC device 124 can be incorporated into the semiconductor package 120 in accordance with an embodiment of the present disclosure.

The availability of printable silicon inks provides the ability to print electrical devices 122, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 202 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

In one embodiment, a plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semi-conductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 10:
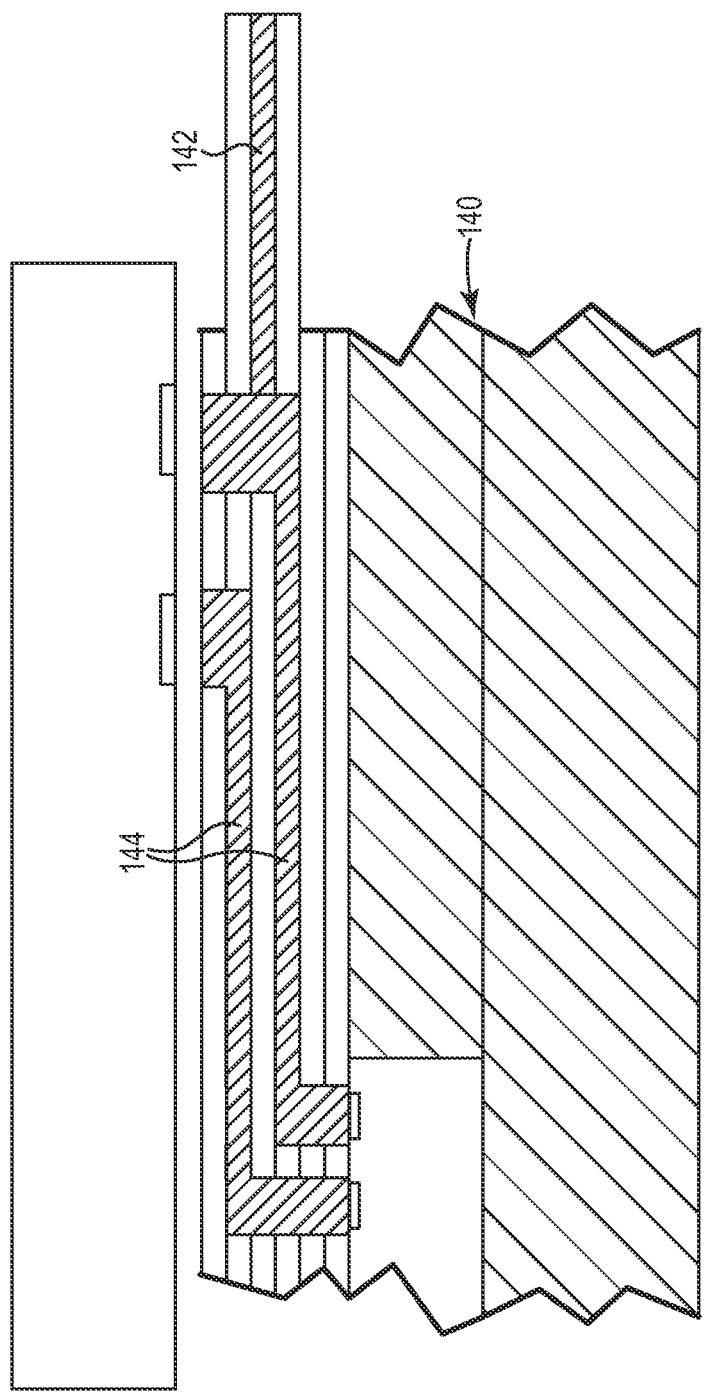
FIG. 10 illustrates an alternate compliant printed semiconductor package with printed external routing in accordance with an embodiment of the present disclosure.

FIG. 10 illustrates an alternate semiconductor package 140 with external routing 142 in accordance with an embodiment of the present disclosure. The external routing 142 is preferably an extension of circuit geometer 144 made using the printing technology discussed above. The external routing 142 can be constructed to accommodate connection to desired functions, such as for example, power management and delivery, tester interface, functional display or indicators, and the like.

Figure 11:
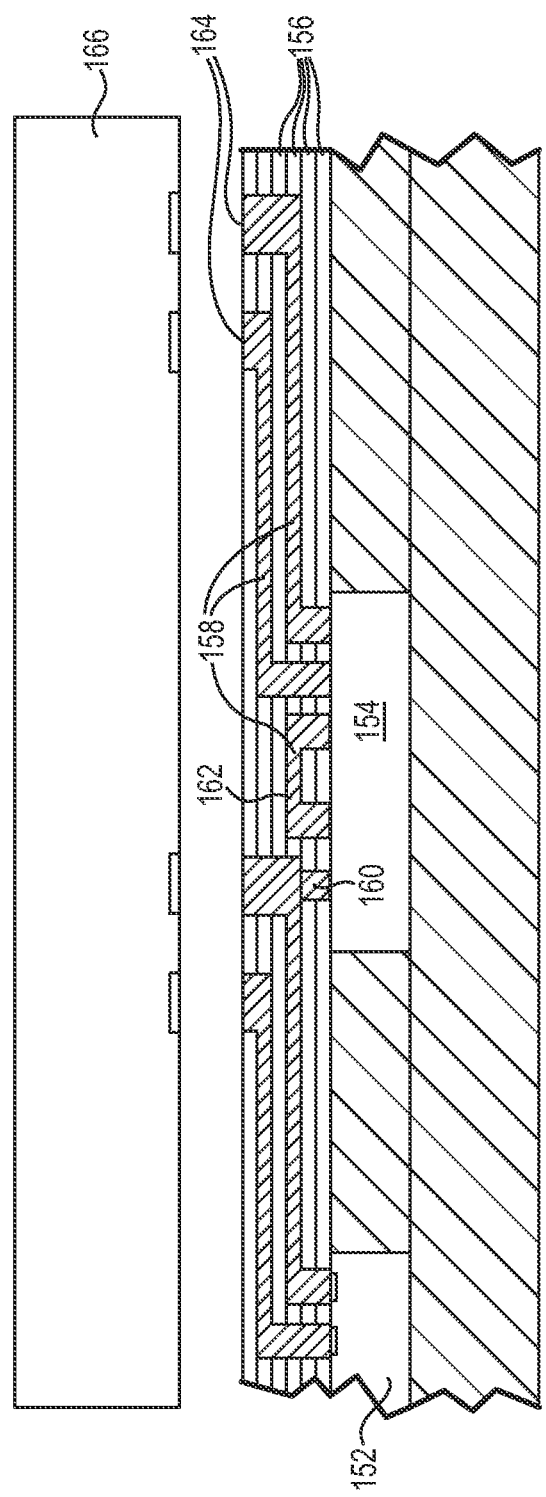
FIG. 11 illustrates a multichip compliant printed semiconductor package in accordance with an embodiment of the present disclosure.

FIG. 11 illustrates a semiconductor package 150 that simulates a system in package (SIP) or multichip module format, in accordance with an embodiment of the present disclosure. Multiple IC devices 152, 154 are located in the semiconductor package 150. Dielectric layers 156 and circuit geometry 158 are printed as discussed above. The circuit geometry 158 permits inter-die circuit paths 160 and intra-die circuit paths 162. Contact pads 164 can be configured in a variety of ways to couple with circuit member 166.

Figure 12:
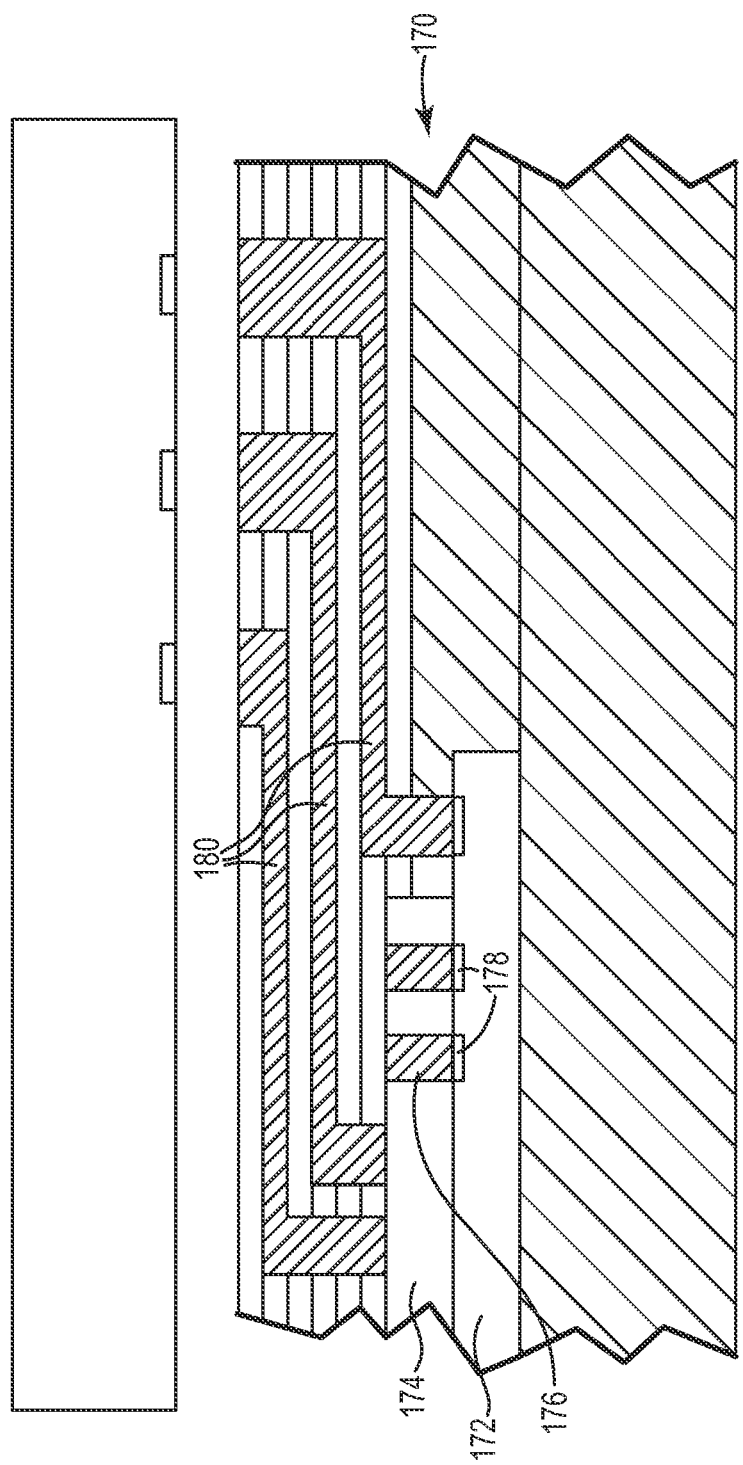
FIG. 12 illustrates a stacked multichip compliant printed semiconductor package in accordance with an embodiment of the present disclosure.

FIG. 12 illustrates a semiconductor package 170 with stacked IC devices 172, 174 in accordance with an embodiment of the present disclosure. Through silicon vias 176 permit contact pads 178 on IC device 172 to electrically couple with circuit geometry 180 and/or IC device 174. The through silicon vias 176 eliminate edge wiring and permit a shorter vertical stack. The through silicon vias 176 can be formed using the printing processes discussed herein or other methods.

FIG. 13 illustrates an alternate semiconductor package 200 in accordance with an embodiment of the present disclosure. RF shielding 202 is optionally printed in recess 204 of substrate 206. In one embodiment, substrate 206 is optimized for thermal management. In another embodiment, IC device 208 is retained to substrate 206 by overmolding or encapsulation 210.

Dielectric layers 212 and circuit geometry 214 are preferably printed as discussed above. In the embodiment of FIG. 13, the circuit geometry 214 is configured to add additional IC device 216 in a double sided configuration. Alternatively, the semiconductor package 200 can be mated with another assembly to create a complex system in package or multichip module.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either or both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making a package for a semiconductor device having electrical terminals, the method comprising the step of:
   locating at least one semiconductor device on a substrate;
   printing a first dielectric layer on at least a portion of the semiconductor device comprising first recesses aligned with a plurality of the electrical terminals;
   depositing a conductive material in the first recesses forming contact members on the semiconductor device;
   printing a second dielectric layer on at least a portion of the first dielectric layer comprising second recesses aligned with a plurality of the first recesses;
   depositing a conductive material in at least a portion of the second recesses comprising a circuit geometry, the circuit geometry comprising a plurality of exposed terminals; and
   depositing a compliant material in recesses in one or more of the first and second dielectric layers adjacent to a plurality of the exposed terminals to permit the exposed terminals to move within the dielectric layers relative to the substrate.

2. The method of claim 1 comprising the step of depositing a conductive plating layer on one or more of the contact members, the exposed terminals, and the circuit geometry.

3. The method of claim 1 comprising locating the compliant material between the exposed terminals and the substrate.

4. The method of claim 1 comprising:
   printing at least one electrical device on one of a dielectric layer or the substrate; and
   electrically coupled the electrical device to at least a portion of the circuit geometry.

5. The method of claim 1 depositing conductive materials so the exposed terminals extend above the package.

6. The method of claim 1 comprising depositing a conductive material in the recesses for form a plurality of vias electrically coupling adjacent layers of the package.

7. The method of claim 1 comprising the steps of:
   forming at least one external dielectric layer extending beyond the package; and
   depositing a conductive material on the external dielectric layer forming external routing electrically coupled to a portion of the circuit geometry.

8. The method of claim 1 comprising the steps of:
   locating a plurality of semiconductor devices on the substrate; and
   depositing the conductive material so the circuit geometry to include at least one inter-die circuit path or intra-die circuit paths.

9. The method of claim 1 comprising the steps of:
   stacking at least two semiconductor devices vertically on the substrate; and
   electrically coupling at least two of the stacked semiconductor devices with a plurality of through silicon vias.

10. The method of claim 1 comprising the steps of:
    locating a plurality of semiconductor devices on the substrate; and
    electrically coupling the plurality of semiconductor devices with the circuit geometry.

11. The method of claim 1 comprising the step of arranging a conductive material, a non-conductive material, and a semi-conductive material on a single layer of the package.

12. The method of claim 1 comprising locating the exposed terminals offset from the electric terminals on the semiconductor device.

13. The method of claim 1 comprising encapsulating the semiconductor device to the substrate so that the semiconductor device is electrically accessible via the exposed terminals.

14. The method of claim 1 comprising depositing the compliant material so the exposed terminals can move relative to the substrate.

15. The method of claim 1 comprising depositing the resilient material so the exposed terminal can move in at least three degrees of freedom relative to the substrate.

16. The method of claim 1 comprising the steps of:
    locating pre-formed conductive trace materials in the second recesses; and
    plating the second recesses.

17. The method of claim 1 comprising the steps of:
    pressing a conductive foil into at least a portion of the second recesses;
    shearing the conductive foil along edges of the second recesses;
    removing excess conductive foil not located in the second recesses; and
    plating the second recesses to form conductive traces.

18. A method of making an electrical assembly comprising the steps of:
    forming the package of claim 1; and
    electrically coupling the exposed terminals on the package with a plurality of contact pads on a circuit member.

19. The method of making an electrical assembly of claim 18 comprising selecting the circuit member from one of a dielectric layer, a printed circuit board, a flexible circuit, a bare die device, an integrated circuit device, organic or inorganic substrates, or a rigid circuit.

20. A method of making a package for a semiconductor device having electrical terminals, the method comprising the step of:
    locating at least one semiconductor device on a substrate;
    printing a first dielectric layer on at least a portion of the semiconductor device comprising first recesses aligned with a plurality of the electrical terminals;
    depositing a conductive material in the first recesses forming contact members on the semiconductor device;

printing a second dielectric layer on at least a portion of the first dielectric layer comprising second recesses aligned with a plurality of the first recesses;

depositing a conductive material in at least a portion of the second recesses comprising a circuit geometry;

printing a third dielectric layer selectively printed on at least a portion of the second dielectric layer comprising third recesses aligned with a portion of the circuit geometry;

depositing a conductive material in the third recesses comprising a plurality of exposed terminals that are offset from, and electrically coupled to the electric terminals on the semiconductor device by the circuit geometry; and depositing a compliant material in recesses in one or more of the first, second or third dielectric layers adjacent to a plurality of the exposed terminals to permit the exposed terminals to move within the dielectric layers relative to the substrate.

* * * * *